United States Patent [19]
Okada et al.

[11] Patent Number: 4,792,463
[45] Date of Patent: Dec. 20, 1988

[54] METHOD OF PRODUCING FERROELECTRIC THIN FILM

[75] Inventors: Masaru Okada, 21 Banchi, Kandaijin-cho, Kasugai-city, Aichi-prefecture; Katsuhiko Tomita, Kyoto, both of Japan

[73] Assignees: Masaru Okada, Aichi; Horiba, Ltd., Kyoto, both of Japan

[21] Appl. No.: 903,134

[22] Filed: Sep. 3, 1986

[30] Foreign Application Priority Data

Sep. 17, 1985 [JP] Japan .................................. 60-205653

[51] Int. Cl.$^4$ ..................... B05D 5/12; C23C 16/40
[52] U.S. Cl. .................. 427/126.3; 427/100; 427/255; 427/255.3
[58] Field of Search ................ 427/255.3, 255, 126.3, 427/100

[56] References Cited

U.S. PATENT DOCUMENTS

| | | | |
|---|---|---|---|
| 3,307,983 | 3/1967 | De Haan et al. | 427/255.3 |
| 4,001,099 | 1/1977 | Wang et al. | 427/255.3 |
| 4,478,877 | 10/1984 | Krevet et al. | 427/255.3 |
| 4,510,182 | 4/1985 | Cornils et al. | 427/255 |
| 4,514,441 | 4/1985 | Alexander | 427/255.3 |
| 4,591,509 | 5/1986 | Krevet et al. | 427/255 |

FOREIGN PATENT DOCUMENTS

| | | | |
|---|---|---|---|
| 52-58895 | 5/1977 | Japan | 427/255 |
| 52-58896 | 5/1977 | Japan | 427/255 |
| 52-58897 | 5/1977 | Japan | 427/255 |
| 52-60989 | 5/1977 | Japan | 427/255 |

OTHER PUBLICATIONS

Powell et al., "Vapor Deposition", pp. 283–285 and 301–302 and 384–386, TS 695 P6, 1966.
Nakagawa et al., "Preparation of PbTiO$_3$ Ferroelectric Thin Film by Chemical Vapour Deposition", Japanese Journal of Applied Physics, vol. 21, No. 10, Oct. 1982, pp. L655–L656.

*Primary Examiner*—Sadie Childs
*Attorney, Agent, or Firm*—Wenderoth, Lind & Ponack

[57] ABSTRACT

Method of producing a ferroelectric thin film by chemical vapor deposition, by providing a gaseous mixture containing oxygen and a gaseous raw material containing (A) alkyl lead and or alkyl bismuth together with an alcoholate of titanium, zirconium, silicon, germanium or niobium, (B) alkyl lead and alkyl germanium, or (C) alkyl bismuth and alkyl lead, and reacting the oxygen and gaseous raw material to oxidize the components of (A), (B) or (C), to form the thin film on the substrate.

7 Claims, 3 Drawing Sheets

METHOD OF PRODUCING FERROELECTRIC THIN FILM

BACKGROUND OF THE INVENTION

1. Field of the Invention

The present invention relates to a method of producing a ferroelectric thin film by chemical vapor deposition.

2. Description of the Prior Art

A ferroelectric substance has been practically used in many fields in view of the pyroelectric, piezoelectric and ferroelectric properties thereof, or the electro-optic effect thereof.

In many cases, single crystalline substances, such as glycine sulfate (TGS), $LiTaO_3$ and $LiNbO_3$, and sintered ceramics, such as $BaTiO_3$, $PbTiO_3$, $PbZr_xTi_{1-x}O_3$ where x is the number of zirconium atoms, and $PbLa_xZr_yTi_{1-(x+y)}O_3$ (PLZT) where x is the number of lanthanum atoms and y is the number of zirconium atoms, have been used as materials of a ferroelectric substance. In many cases ot producing a device from these materials, the materials are cut and polished into a thick film of 50 to 500 $\mu m$.

However, single crystalline substances are generally difficult to produce, expensive and difficult to convert to a film due to the cleavage thereof.

On the other hand, ceramic porcelains have problems in that since they are generally fragile, many cracks are produced in the working process; it is difficult to obtain a thin film having a thickness of 50 $\mu m$ or less, requiring a high level of working technique and much time; and they have high production cost.

In view of the above, it has been strongly desired to establish a method of producing a thin film of 1 to 30 $\mu m$ thickness, with the objects of improvement in performance, miniaturization, multiple functionalization, provision of high performance, reduction of cost, and the like, for a device using a ferroelectric substance.

For example, the high-frequency spattering method or the magnetron spattering method with sintered bodies such as $PbTiO_3$, PZT and PLZT as a target has been known as a method of producing a ferroelectric thin film made of $PbTiO_3$, PZT, PLZT and the like.

The chemical vapor deposition method has been known as another method of producing the above described ferroelectric thin films. This method has developed as a method of forming a surface-protecting film, such as $SiO_2$, $Si_3N_4$ and $Al_2O_3$, and a gate-insulating film of MOSFET in the semiconductor and electronics industries, and at present it is an important process of producing a semiconductor device. Also, it has been used as a method of forming a surface-coating film on heat resistant, corrosion resistant and abrasion resistant parts.

As a method of producing a ferroelectric thin film by the chemical vapor deposition method, there are known a method of producing a thin film of $PbTiO_3$, in which water vapor and oxygen act upon lead chloride and titanium tetrachloride in the gaseous phase, and a method of producing a thin film of $PbTiO_3$ by the reaction of titanium tetrachloride, lead thenoyltrifluoroacetone or acetylacetonate and water vapor among themselves in the gaseous phase.

Of the above described conventional methods of producing a ferroelectric thin film the high-frequency spattering method and the magnetron sputtering method have the problem that the deposition rate of a ferroelectric substance is small, i.e. to an extent of 10 to 50 Å/min, and it takes a long time to obtain a film having the desired thickness. In addition, since constituent atoms of sintered bodies used as a target are different in spattering coefficient, the ferroelectric thin film which is formed has a different composition than the target, and it is difficult to control the composition of the thin film to the stoichiometric value. Many other problems also occur in that, for example, damage is caused and defects are produced in the substrate surface and the resulting film owing to high-energy atoms and ions during the spattering.

As to the case where the chemical gas phase growth method is used, in a method in which lead chloride and titanium tetrachloride are used, since lead chloride is solid at normal temperature and has a small vppor pressure, a high temperature of 700° C. is required for the vaporization thereof, and since it is difficult to control the vapor pressure of lead chloride, the resulting $PbTiO_3$ thin films show different compositions. Also, problems occur in that, for example, since the resulting thin film contains lead chloride, it is difficult to produce a pure $PbTiO_3$ thin film whereby a $PbTiO_3$ thin film have a superior performance as a ferroelectric thin film can not be obtained.

Furthermore, the chemical vapor deposition method, in which titanium tetrachloride and lead thenoyltrifluoroacetone or lead acetylacetonate are used, has a problem in that the vaporization of organo-lead compounds requires 180° to 220° C., and the organo-lead compounds are gradually decomposed at this temperature. Accordingly, the composition of the gaseous mixture is changed with the lapse of time, whereby it is difficult to control the chemical composition of the objective $PbTiO_3$ to a constant value.

Also, in the above described method using the chemical vapor deposition method, since titanium tetrachloride is used as a raw material for titanium oxide in both examples, the apparatus and the object substrate are corroded owing to the corrosive property of the resulting HCl gas, so that a problem also occurs in that the material of the substrate is limited to a material which is resistant to high-temperature, HCl-containing water.

SUMMARY OF THE INVENTION

It is an object of the present invention to provide a method of producing a ferroelectric thin film by the chemical vapor deposition method in which the film-forming speed is high and the film is uniform in composition, and in which the composition can be controlled stoichiometrically.

In accordance with the present invention, this and other objects are accomplished by a method which comprises providing a gaseous mixture containing oxygen and a gaseous raw material containing alkyl lead and/or alkyl bismuth, and reacting the oxygen and gaseous raw material on a substrate to form a thin film.

DETAILED DESCRIPTION OF THE INVENTION

Figure 1:
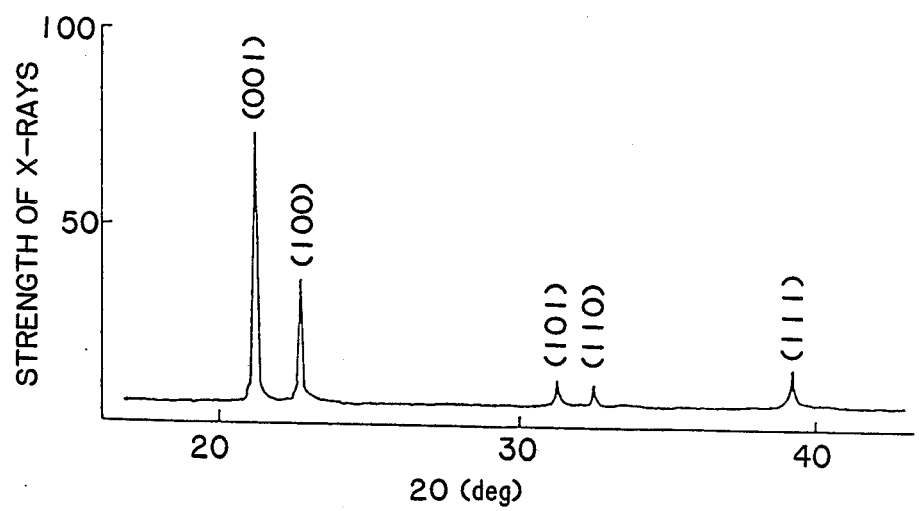
FIG. 1 is an X-ray diffraction diagram of a ferroelectric thin film formed by a method according to the present invention.

More particularly, the present invention is directed to a method of producing a ferroelectric film by chemical vapor deposition, which comprises:

providing a gaseous mixture containing oxygen and a gaseous raw material selected from the group consisting of (A), (B) and (C), wherein (A) is at least one member selected from the group consisting of alkyl lead and alkyl bismuth, and at least one member selected from the group consisting of alcoholates of titanium, zirconium, silicon, germanium and niobium, (B) is alkyl lead and alkyl germanium, and (C) is alkyl bismuth and alkyl lead, said oxygen being present in said gaseous mixture in an amount which is at least sufficient to oxidize the components of said (A), (B) or (C) and reacting said oxygen and gaseous raw material at a pressure of not more than about atmospheric pressure on a substrate having a temperature which is at least sufficient to oxidize the components of said (A), (B) or (C), to form on said substrate a film, having a thickness of 1 to 30 μm, selected from the group consisting of $PbTiO_3$, $PbZrO_3$, $PbZrTiO_3$, $Pb_5Ge_3O_{11}$, $Bi_{12}TiO_{20}$, $Bi_{12}PbO_{19}$, $Bi_{12}SiO_{20}$, $Bi_{12}GeO_{20}$, $Pb_2Bi_4Ti_5O_{18}$ and $PbBi_2Nb_2O_9$.

In a preferred embodiment of the present invention, the gaseous raw material is introduced into a mixing chamber by means of an inert carrier gas, and is mixed with the oxygen in the mixing chamber to provide the gaseous mixture. The gaseous mixture is then contacted with the substrate at the indicated temperature and pressure to form the thin film on the substrate.

It is also preferred that the oxygen is mixed with the inert carrier gas before the oxygen is introduced into the mixing chamber.

Alkyl compounds of lead, bismuth and are expressed by the general molecular formulae $Pb(C_nH_{2n+1})_4$, $Bi(C_nH_{2n+1})_3$ and $Ge(C_nH_{2n+1})_4$. In the present invention, the alkyl compounds expressed by the above described molecular formulae in which n is 1 to 8 can be used. In addition, alcoholates of titanium, zirconium, silicon, germanium and niobium are expressed by the general molecular formulae $Ti(C_nH_{2n+1}O)_4$, $Zr(C_nH_{2n+1}O)_4$, $Si(C_nH_{2n+1}O)_4$, $Ge(C_nH_{2n+1}O)_4$ and $Nb(C_nH_{2n+1}O)_5$. In the present invention, the alcoholates expressed by the above described molecular formulae, in which n is 1 to 8, can be used.

Examples of the alkyl lead used in the present invention include $Pb(C_2H_5)_4$ and $Pb(CH_3)_4$, while examples of the alkyl bismuth include $Bi(C_2H_5)_3$ and $Bi(CH_3)_3$.

Examples of the alcoholates of titanium, zirconium, silicon, germanium and niobium include $Ti(i-OC_3H_7)_4$, $Zr(i-OC_3H_7)_4$, $Si(OC_2H_5)_4$, $Ge(i-OC_3H_7)_4$, $Nb(OC_2H_5)_5$ and the like.

Examples of the alkyl germanium include $Ge(CH_3)_4$ and $Ge(C_2H_5)_4$.

$N_2$ and Ar are examples of the inert carrier gas.

Since alkyl lead and alkyl bismuth used in the present invention have moderate vapor pressure at temperatures near normal temperature, and are remarkably stable compounds, they are easy to handle and react with oxygen at temperatures of 300° C. or more to form lead oxide and bismuth oxide. Also, alcoholates of titanium, zirconium, silicon, germanium and niobium are corrosion resistant at high temperatures, like the alkyl lead and alkyl bismuth,aand are thermally decomposed at temperatures of 350° C. or more to form titanium oxide, zirconium oxide, silicon oxide, germanium oxide and niobium oxide. Further, since these oxides are deposited under mild reaction conditions such as thermochemical reaction at comparatively low temperatures, a small number of crystalline defects are produced in the resulting ferroelectric thin film whereby the interfacial state between the substrate and the ferroelectric thin film can be improved.

Examples of the substrate to be used in the present invention, on which the thin film is deposited, include single crystalline silicon, magnesium oxide and sapphire.

Preferably, the substrate has a temperature of at least 300° C., for example 300° to 800° C., more preferably at least 500° C., for example 500° to 800° C.

The deposition speed of an independent film of lead oxide, bismuth oxide, titanium oxide, zirconium oxide, silicon oxide, germanium oxide or niobium oxide can be measured with high accuracy by preliminary experiments using an ellipsometer. The deposition speed of these oxide films can be strictly controlled by changing the temperature of each gaseous raw material (e.g. alkyl lead, titanium alcoholate, etc.) and the flow rate of the carrier gas, such as nitrogen or argon, which can be passed through the gaseous raw material to from the mixture of raw material and carrier gas.

After these preliminary experiments, a ferroelectric thin film having a uniform thickness and a uniform stoichiometric composition can be obtained by using the gaeeous mixture composition and the reacting condition determined from a film-thickness ratio by calculation.

The present invention will now be illustrated by reference to the following working examples, although it is to be understood that the invention is not limited to these examples.

EXAMPLE 1

Tetraethyl lead [$Pb(C_2H_5)_4$] and iso-propoxy titanium [$Ti(i-OC_3H_7)_4$] gases in admixture with $N_2$ as a carrier gas are mixed with oxygen having a flow rate of 200 ml/min diluted with $N_2$ having a flow rate of 1,600 ml/min.

This gaseous mixture is obtained as follows.

Thus, a tetraethyl lead evaporator provided with a bellows valve made of stainless steel is maintained at 30° C., and $N_2$ as a carrier gas is passed through this evaporator at 200 ml/min. Similarly, an evaporator for iso-propoxy titanium is maintained at 60° C., and $N_2$ as a carrier gas is passed through this evaporator at 1,000 ml/min. The resultant gaseous raw material mixtures are mixed with each other and with oxygen.

The resulting gaseous mixture is flown out from a pointed end portion of a nozzle (diameter 40 mm) made of pyrex glass, onto a silicon substrate (20×20×0.4 mm) horizontally placed on a heating plate (diameter 45 mm) made of stainless steel and heated to 600° C., to deposit a $PbTiO_3$ thin film on the substrate.

The distance between the pointed end of the nozzle and the substrate is 5 mm. In addition, the total gas pressure of the reaction system is 1 atmosphere but the reaction may be carried out under reduced pressure, for example 1 Torr. The deposition rate of $PbTiO_3$ under these reaction conditions was about 500 Å/min.

The $PbTiO_3$ film obtained according to this example is fine grained polycrystalline, and the grains can be grown by thermally treating it at 800° C. in air.

The properties of the crystallized thin films are shown in Table 1. The $PbTiO_3$ thin film was uniform in thickness, and it was found from an analysis by means of an X-ray microanalyzer that the atomic ratio of lead to titanium was nearly 1:1.

The film thickness can be varied from 100 Å to several tens μm, depending upon the reaction time. Also, a polycrystalline film can be grown at temperatures of 500° C. or more.

TABLE 1

| Product | $PbTiO_3$ |
|---|---|
| Structure by X-rays | Perovskite type polycrystal |
| Particle diameter of product | 1–2 μm |

Figure 2:
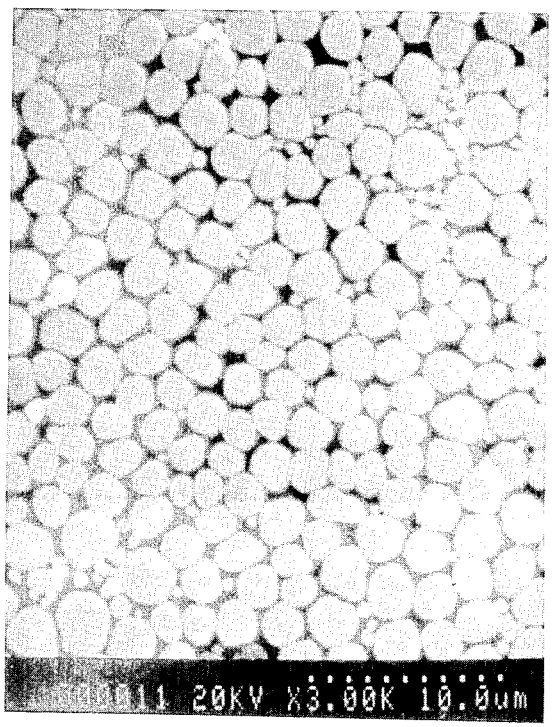
FIG. 2 is an electron microscopic photograph showing the crystalline structure of a surface of the same ferroelectric thin film as shown in FIG. 1.

An X-ray diffraction diagram of the $PbTiO_3$ thin film is shown in FIG. 1, and an electron microscopic photograph of a surface of the thin film is shown in FIG. 2.

EXAMPLE 2

A $PbZrO_3$ thin film was formed in the same manner as in Example 1 excepting that $Pb(C_2H_5)_4$ and $Zr(i-OC_3H_7)_4$ were used. The conditions of forming the thin film are shown in Table 2, and the properties in Table 3.

TABLE 2

| Product | Raw Material | Temperature (°C.) | Flow rate of carrier gas (ml/min) | Flow rate of oxygen (ml/min) | Flow rate of diluting gas (ml/min) |
|---|---|---|---|---|---|
| $PbZrO_3$ | $Pb(C_2H_5)_4$ | 30 | 200 | 200 | 1,900 |
| | $Zr(i-OC_3H_7)_4$ | 175 | 700 | | |

TABLE 3

| Product | $PbZrO_3$ |
|---|---|
| Substrate and its temperature | Silicon, 650° C. |
| Deposition rate | 500 Å/min |
| Structure by X-ray | ortharhombic polycrystal |
| Particle diameter of product | 1–2 μm |

EXAMPLE 3

A $PbZrTiO_3$ thin film was formed in the same manner as in Example 1 excepting that $Pb(C_2H_5)_4$, $Ti(i-OC_3H_7)_4$ and $Zr(i-OC_3H_7)_4$ were used. The conditions of forming this thin film are shown in Table 4, and the properties in Table 5.

TABLE 4

| Product | Raw Material | Temperature (°C.) | Flow rate of carrier gas (ml/min) | Flow rate of oxygen (ml/min) | Flow rate of diluting gas (ml/min) |
|---|---|---|---|---|---|
| $PbZrTiO_3$ | $Pb(C_2H_5)_4$ | 40 | 500 | 200 | 600 |
| | $Ti(i-OC_3H_7)_4$ | 60 | 1,000 | | |
| | $Zr(i-OC_3H_7)_4$ | 175 | 700 | | |

TABLE 5

| Product | $PbZrTiO_3$ |
|---|---|
| Substrate and its temperature | Silicon, 650° C. |
| Deposition rate | 750 Å/min |
| Crystalline structure by X-ray | Perovskite type polycrystal |
| Particle diameter of product | 2–3 μm |

In the case where $Pb_5Ge_3O_{11}$ is formed as a ferroelectric thin film, for example $Pb(C_2H_5)_4$ and $Ge(i-OC_3H_7)_4$, or other alkyl lead and alkyl germanium, are used as gaseous raw materials.

EXAMPLE 4

Trimethyl bismuth $[Bi(CH_3)_3]$ and iso-propoxy titanium $Ti(i-OC_3H_7)_4$ gases accompanied by $N_2$ as a carrier gas are mixed with oxygen having a flow rate of 200 ml/min diluted with $N_2$ having a flow rate of 1,300 ml/min.

The temperature of the evaporator for trimethyl bismuth provided with bellows valve made of stailess steel is maintained at 0° C., and the flow rate of $N_2$ as a carrier gas passing through this evaporator is 500 ml/min. The temperature of the evaporator for iso-propoxy titanium is maintained 60° C., and the flow rate of $N_2$ as a carrier gas passing through this evaporator is 1,000 ml/min.

A $Bi_{12}TiO_{20}$ thin film was formed from this gaseous mixture in the same manner as in Example 1. The properties of the thin film are shown in Table 6.

TABLE 6

| Product | $Bi_{12}TiO_{20}$ |
|---|---|
| Substrate and its temperature | Silicon, 650° C. |
| Deposition rate | 500 Å/min |
| Crystalline structure by X-ray | Tetragonal polycrystal |
| Particle diameter of product | 2–3 μm |

A $Bi_{12}PbO_{19}$ thin film can be formed using $Bi(CH_3)_3$ and $Pb(C_2H_5)_4$ as raw materials in the same manner as in Example 4; a $Bi_{12}GeO_{20}$ thin film can be formed using $Bi(CH_3)_3$ and $Ge(i-OC_3H_7)_4$ as raw materials; and a $Bi_{12}SiO_{20}$ thin film can be formed using $Bi(CH_3)_3$ and $Si(OC_2H_5)_4$ as raw materials.

EXAMPLE 5

A $PbBi_2Nb_2O_9$ thin film was formed using $Pb(C_2H_5)_4$, $Bi(CH_3)_3$ and $Nb(OC_2H_5)_5$ is the same manner as in Examples 1 and 4. The conditions of forming this thin film are shown in Table 7, and the properties in Table 8.

TABLE 7

| Product | Raw materials | Temperature (°C.) | Flow rate of carrier gas (ml/min) | Flow rate of oxygen (ml/min) | Flow rate of diluting gas (ml/min) |
|---|---|---|---|---|---|
| $PbBi_2Nb_2O_9$ | $Pb(C_2H_5)_4$ | 40 | 200 | 300 | 1,000 |
| | $Bi(CH_3)_3$ | 0 | 500 | | |
| | $Nb(OC_2H_5)_5$ | 150 | 1,000 | | |

TABLE 8

| Product | $PbBi_2Nb_2O_9$ |
|---|---|
| Substrate and | Silicon, 650° C. |

TABLE 8-continued

| | |
|---|---|
| its temperature | |
| Deposition rate | 700 Å/min |
| Crystalline structure by X-ray | Tetragonal polycrystal |
| Particle diameter of product | 2-5 μm |

In the case where a $Pb_2Bi_4Ti_5O_{18}$ thin film is formed, for example $Pb(C_2H_5)_4$, $Bi(CH_3)_3$ and $Ti(i-OC_3H_7)_4$ are used as gaseous raw materials.

In the above described Examples, the deposition temperature was 650° C., but an amorphous film was obtained at temperatures of less than the crystallization temperature, while a polycrystalline film was obtained at temperatures of the crystallization temperature or more. In addition, although a single crystalline silicon as a substrate was shown in the above described Examples, magnesium oxide, sapphire and the like may be used. And, since if the substrate formed of magnesium oxide or sapphire is used, a C-axis oriented film can be formed, a ferroelectric film which fits the desired use, can be obtained by selecting the deposition temperature and the substrate.

A ferroelectric thin film for use in an infrared sensor is produced by a method according to the present invention, as shown in FIG. 3.

Figure 3A:
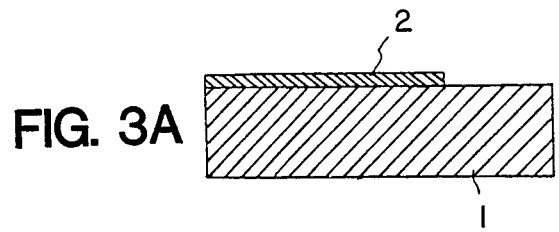
FIG. 3 shows a process for producing an infrared sensor using a ferroelectric thin film formed by the present invention.
Figure 3B:
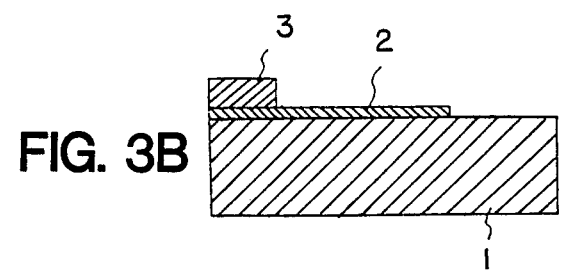
Figure 3C:
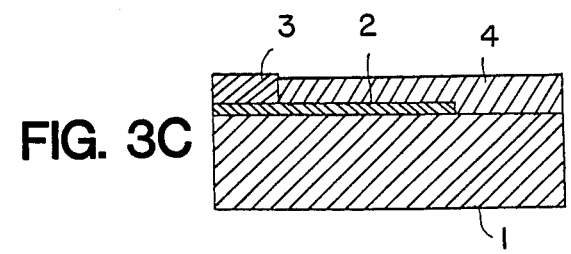

In FIG. 3(A), a shadow mask is overlapped on the desired portion of one side of a substrate 1 made of magnesium oxide, and then a lower electrode 2 made of platinum is formed on an exposed portion of said one side of the substrate 1. Subsequently, as shown in FIG. 3(B), the portion of the lower electrode 2 which is to be a terminal is masked with a masking plate 3. The substrate 1 is placed on a hot plate made of stainless steel within an electric furnace to form a $PbTiO_3$ ferroelectric thin film 4 of 20 μm thickness on substrate 1 and lower electrode 2, as shown in FIG. 3(C), in the same manner as in Example 1, using $Pb(C_2H_5)_4$ and $Ti(i-OC_3H_7)_4$ as gaseous raw materials. Then, the masking plate 3 is removed.

Figure 3D:
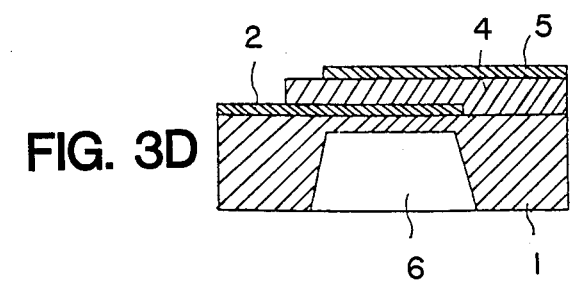

After the resulting ferroelectric thin film 4 was subjected to crystallizing treatment for 60 minutes at 800° C., as shown in FIG. 3(D) a concave portion 6 is formed in the substrate 1 by etching, and an upper electrode 5 made of gold is formed on the surface of the ferroelectric thin film 4.

Subsequently, the resulting assembly is subjected to single-division treatment at 200° C. and 100 KV/cm to obtain an infrared sensor.

Figure 4:
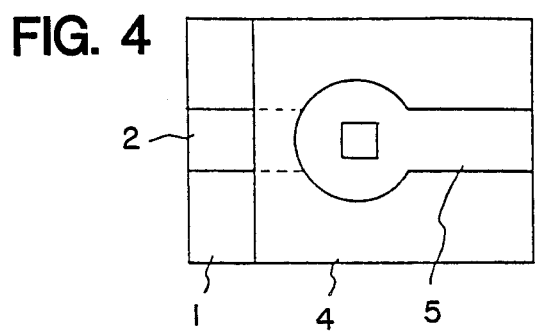
FIG. 4 is a plan view showing the infrared sensor produced as shown in FIG. 3.

FIG. 4 is a plan view showing the infrared sensor.

Since a method of producing a ferroelectric thin film by the chemical vapor deposition method according to the present invention uses alkyl lead, alkyl bismuth, and alcoholates of titanium, iirconium, silicon, germanium and niobium as gaseous raw materials, a thin film having a uniform composition without impurities, can be formed and the composition can be optionally controlled, whereby a ferroelectric thin film which fits the desired use and the like can be obtained.

In addition, since the thin film is deposited under mild reaction conditions such as thermochemical reaction at relatively low temperatures, only a small number of crystalline defects are produced in the film, whereby a ferroelectric thin film having a superior interfacial state between it and a substrate can be obtained.

The deposition rate of the film is larger than those of the spattering method by a factor of 10-50, and since no defect or damage at the substrate surface is produced, it is also possible to deposit the thin film directly on a ate of field effect transistor.

Also, since the reactive substances used as gaseous raw materials generate no corrosive gas, optional reaction apparatus and substrate materials can be used.

We claim:

1. A method of producing a ferroelectric film by chemical vapor deposition, which comprises:
   providing a gaseous mixture containing oxygen and a gaseous raw material selected from the group consisting of (A), (B) and (C), wherein (A) is at least one member selected from the group consisting of alkyl lead and alkyl bismuth, and at least one member selected from the group consisting of alcoholates of titanium, zirconium, silicon, germanium and niobium, (B) is alkyl lead and alkyl germanium, and (C) is alkyl bismuth and alkyl lead, said oxygen being present in said gaseous mixture in an amount which is at least sufficient to oxidize the components of said (A), (B) or (C); and
   reacting said oxygen and gaseous raw material at a pressure of not more than about atmospheric pressure on a substrate having a temperature which is at least sufficient to oxidize the components of said (A), (B) or (C), to form on said substrate a film, having a thickness of 1 to 30 μm, selected from the group consisting of $PbTiO_3$, $PbZrO_3$, $PbZrTiO_3$, $Pb_5Ge_3O_{11}$, $Bi_{12}TiO_{20}$, $Bi_{12}PbO_{19}$, $Bi_{12}SiO_{20}$, $Bi_{12}GeO_{20}$, $Pb_2Bi_4Ti_5O_{18}$ and $PbBi_2Nb_2O_9$.

2. A method according to claim 1, wherein said substrate is selected from the group consisting of single crystalline silicon, magnesium oxide and sapphire.

3. A method according to claim 1, wherein said substrate has a temperature of 300° to 800° C.

4. A method according to claim 1, wherein said substrate has a temperature of at least 500° C., 5. A method according to claim 4, wherein said temperature is 500° to 800° C.

6. A method of producing a ferroelectric film by chemical vapor deposition, which comprises:
   providing a gaseous raw materials selected from the group consisting of (A), (B) and (C), wherein (A) is at least one member selected from the group consisting of alkyl lead and alkyl bismuth, and at least one member selected from the group consisting of alcoholates of titanium, zirconium, silicon, germanium and niobium, (B) is alkyl lead and alkyl germanium, and (C) is alkyl bismuth and alkyl lead;
   introducing said gaseous raw material into a mixing chamber by means of an inert carrier gas;
   mixing said gaseous raw material with oxygen in said mixing chamber to provide a gaseous mixture, said oxygen being present in said gaseous mixture in an amount which is at least sufficient to oxidize the component of said (A), (B) or (C); and
   reacting said oxygen and gaseous raw material at a pressure of not more than about atmospheric pressure on a substrate having a temperature which is at least sufficient to oxidize the components of said (A), (B) or (C), to form on said substrate a film, having a thickness of 1 to 30 μm, selected from the group consisting of $PbTiO_3$, $PbZrO_3$, $PbZrTiO_3$, $Pb_5Ge_3O_{11}$, $Bi_{12}TiO_{20}$, $Bi_{12}PbO_{19}$, $Bi_{12}SiO_{20}$, $Bi_{12}GeO_{20}$, $Pb_2Bi_4Ti_5O_{18}$ and $PbBi_2Nb_2O_9$.

7. A method according to claim 6, wherein said oxygen is mixed with an inert carrier gas before said oxygen is introduced into said mixing chamber.

* * * * *